United States Patent
Berland et al.

(10) Patent No.: US 9,689,925 B2
(45) Date of Patent: *Jun. 27, 2017

(54) RELIABLE ARC FAULT CIRCUIT INTERRUPTER TESTER UTILIZING A DYNAMIC FAULT VOLTAGE

(71) Applicant: Unique Technologies, LLC, Joliet, IL (US)

(72) Inventors: Kerry Berland, Chicago, IL (US); Paul Berland, Elgin, IL (US); Mitch Budniak, Highland Park, IL (US)

(73) Assignee: Unique Technologies, LLC, Joliet, IL (US)

( * ) Notice: Subject to any disclaimer, the term of this patent is extended or adjusted under 35 U.S.C. 154(b) by 589 days.

This patent is subject to a terminal disclaimer.

(21) Appl. No.: 14/076,228

(22) Filed: Nov. 10, 2013

(65) Prior Publication Data

US 2015/0130477 A1 May 14, 2015

Related U.S. Application Data

(63) Continuation of application No. 13/080,746, filed on Apr. 6, 2011, now Pat. No. 8,618,811.

(51) Int. Cl.
*G01R 31/02* (2006.01)
*G01R 31/327* (2006.01)
*G01R 31/07* (2006.01)

(52) U.S. Cl.
CPC ....... *G01R 31/3277* (2013.01); *G01R 31/021* (2013.01); *G01R 31/07* (2013.01); *G01R 31/026* (2013.01)

(58) Field of Classification Search
CPC .... G01R 31/40; G01R 31/42; G01R 31/2827; G01R 31/31721; G01R 31/31924; G01R 31/31922; G01R 31/31937; G01R 31/327; G01R 31/3271–31/3274; G01R 31/2805; G01R 31/024; G01R 31/2812; G01R 31/2884; G01R 31/2853
USPC .......... 324/764.01, 750.01, 750.02, 537, 771
See application file for complete search history.

(56) References Cited

U.S. PATENT DOCUMENTS

| | | | | |
|---|---|---|---|---|
| 5,459,630 A * | 10/1995 | MacKenzie | .......... | H02H 1/0015 324/520 |
| 6,218,844 B1 * | 4/2001 | Wong | ................. | G01R 31/3272 324/424 |
| 6,577,484 B1 * | 6/2003 | Macbeth | .............. | H02H 1/0015 361/92 |
| 6,876,204 B2 * | 4/2005 | Smith | .................. | H02H 1/0015 324/424 |
| 7,872,464 B2 * | 1/2011 | Berland | ............... | G01R 31/041 324/133 |
| 2001/0040458 A1 * | 11/2001 | Macbeth | .............. | H02H 1/0015 324/536 |
| 2007/0109696 A1 * | 5/2007 | Williamson | ........... | H02H 3/338 361/42 |

(Continued)

*Primary Examiner* — Thang Le
(74) *Attorney, Agent, or Firm* — The Law Offices of Konrad Sherinian, LLC

(57) ABSTRACT

An arc fault circuit interrupter test circuit is disclosed. The test circuit incorporates a controller along with at least one power transistor, a current sense circuit and a voltage sense circuit. When the power transistor is operated, the current flowing through the transistor is sensed, and if the current is not at least equal to a threshold value, the voltage at which the power transistor is operated is increased.

9 Claims, 9 Drawing Sheets

(56) References Cited

U.S. PATENT DOCUMENTS

| | | | |
|---|---|---|---|
| 2008/0088992 A1* | 4/2008 | Williamson | H02H 3/338 361/42 |
| 2012/0007621 A1* | 1/2012 | Yue et al. | H01H 83/04 324/750.3 |
| 2012/0089266 A1* | 4/2012 | Tomimbang | H02H 1/0015 700/293 |
| 2012/0257314 A1* | 10/2012 | Armstrong | G01R 31/3272 361/42 |
| 2014/0104731 A1* | 4/2014 | Kolker | G01R 31/025 361/42 |

* cited by examiner

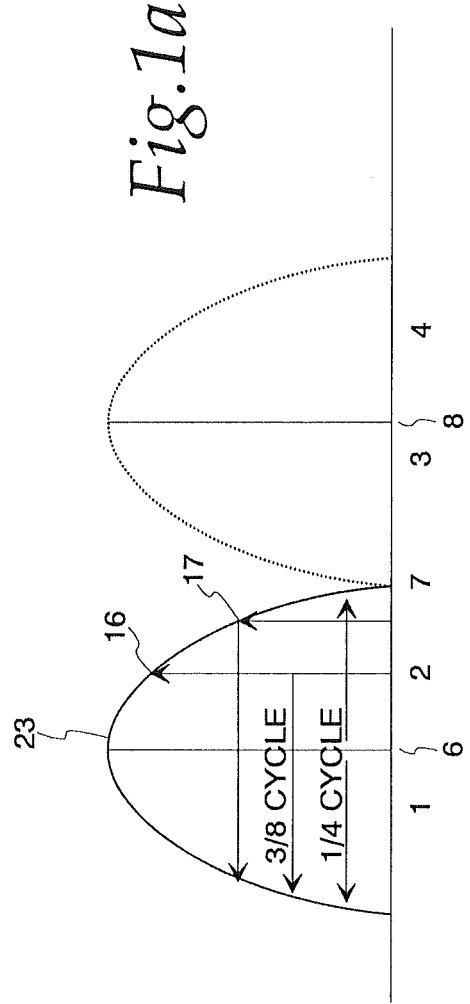

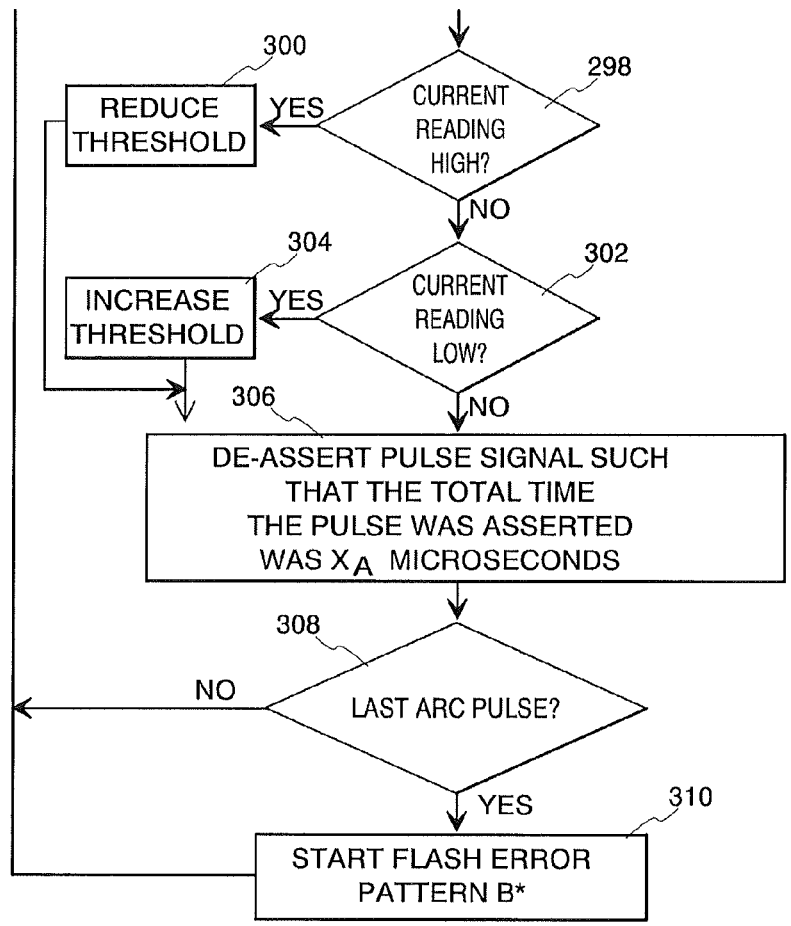

Fig.6c

NOTES:
VH'=MAX(VH,VN)
$X_T$=TOLERANCES BETWEEN SIGNALS
$X_C$=# OF CYCLES FOR STABILITY
$X_D$=DEBOUNCE TIME FOR INDICATION
 (> 1 CYCLE TIME)
$X_{CB}$ =TIME TO FIRE CIRCUIT BREAKER PULSE
$X_A$ =TIME TO FIRE ARC FAULT PULSE
ERROR PATTERN A = 3 FAST FLASHES
ERROR PATTERN B = SLOW BLINK FOR 10 SECONDS

* EXPECTED OPERATION AFTER FIRING ARC PULSES
IS THAT THE UNIT TURNS OFF, EXITING THE FLOW
CHART AND NOT FLASHING AN ERROR CODE.

RELIABLE ARC FAULT CIRCUIT INTERRUPTER TESTER UTILIZING A DYNAMIC FAULT VOLTAGE

CLAIM OF PRIORITY TO RELATED APPLICATION

This is a continuation of U.S. patent application Ser. No. 13/080,746, entitled "Arc Fault Circuit Interrupter Tester With Current Responsive Pulse Timing," filed on Apr. 6, 2011 in the names of inventors Kerry Berland, Paul Berland, and Mitch Budniak and assigned to Unique Technologies, Inc.

FIELD OF THE INVENTION

The present invention relates generally to systems and methods for testing arc fault circuit interrupters and is particularly directed to a test instrument for testing the efficacy of arc fault circuit interrupter installed in electrical distribution circuits and a method of operating the aforementioned test instrument.

DESCRIPTION OF THE PRIOR ART

Circuit breakers interrupt the flow of current after detecting a fault condition in a monitored circuit. Fault conditions can by caused by numerous circuit conditions. Over current faults, for example, are usually caused by a short condition somewhere within a distribution circuit. A circuit breaker designed to interrupt an over current fault can operate by detecting a higher than normal current level for a sufficient period of time. Over current faults can be detected by a number of well-known methods, including the use of a thermal sensitive strip adapted to cause the breaker to trip at a temperature corresponding to the application of a high level of current for a sufficient time, and a magnetic trip circuit, that is adapted to break a protected circuit if the magnetic field associated with the monitored distribution circuit becomes too strong. Accordingly, testers for circuit breakers adapted to break over current faults can be constructed to cause a fault in the power system for a specified length of time and monitor for whether the circuit breaker operated or not.

Another type of fault is known as an "arcing fault." Arcing faults are non-working intermittent electrical arcs, where "non-working" is meant to distinguish between "working" arcs, such as those generated by vacuum cleaner motors, and similar devices. Arcing faults occur when current arcs from one conductor to another, usually through ionized gas, and can generate large amounts of current for short time intervals. While arcing faults are one of the leading causes of electrical fires, there is usually not enough current generated for a sufficient time period to trip a conventional circuit breaker due to the intermittent nature of these types of faults. Accordingly, special arc fault circuit interrupters (AFCI) have been created that can detect the presence of an arcing fault, and interrupt a circuit when an arcing fault is detected. Various testers have been designed to ensure that AFCis are operational, such as, for example, the tester described in U.S. Pat. No. 6,876,204, which is hereby incorporated by reference in its entirety. While these testers are functional, prior art AFCI test circuits are sensitive to the resistance between the tester and the AFCI, as they are designed to generate a current spike of a known magnitude. Accordingly, prior art test circuits may work well when disposed very close to an AFCI, where resistance will be low, but may not work at all if disposed far away from the AFCI being tested, where resistance will be significantly higher.

OBJECTS OF THE INVENTION

Accordingly, it is an object of this invention to provide a system, apparatus, and method for implementing a test circuit for an AFCI that accurately reflects the functional state of the AFCI.

Another object of the invention is to provide a test circuit for testing an AFCI that will properly indicate the functional status of the AFCI when the AFCI is not disposed very close to the test circuit.

Other advantages of the disclosed invention will be clear to a person of ordinary skill in the art. It should be understood, however, that a system, method, or apparatus could practice the disclosed invention while not achieving all of the enumerated advantages, and that the protected invention is defined by the claims.

SUMMARY OF THE INVENTION

The disclosed invention achieves its objectives by providing an arc fault circuit interrupter test circuit and a method operating on a microcontroller for operating an arc fault circuit interrupter test circuit. In one embodiment, the arc fault circuit interrupter test circuit comprises at least one power transistor along with support circuitry needed to electrically couple a hot line of a local power distribution system to a neutral line of a power distribution system. The test circuit further comprises a voltage sense circuit coupled to the hot line and the neutral line of the local power distribution system, a current sense circuit, and a controller. The controller monitors the voltage sense circuit and the current sense circuit, and operates the power transistor by generating a sequence of control pulses. Each control pulse causes the power transistor to couple the hot line to the neutral line, thereby shorting the local power distribution system. During the short, the current flowing through the power transistor is measured using the current sense circuit, which can be coupled to an analog-to-digital converter channel of the microcontroller or to a comparator whose threshold is set by the microcontroller. If the sensed current is lower than a threshold value, the next control pulse is generated at a higher value.

BRIEF DESCRIPTION OF THE DRAWINGS

Although the characteristic features of this invention will be particularly pointed out in the claims, the invention itself, and the manner in which it may be made and used, may be better understood by referring to the following description taken in connection with the accompanying drawings forming a part hereof, wherein like reference numerals refer to like parts throughout the several views and in which:

FIG. 1A is an illustration of one voltage phase of a local alternating current power distribution system;

FIG. 1B is an illustration of short circuit currents that are generated by shorting the voltage waveform of FIG. 1A at various cycle times;

DETAILED DESCRIPTION OF THE ILLUSTRATED EMBODIMENT

Figure 2:
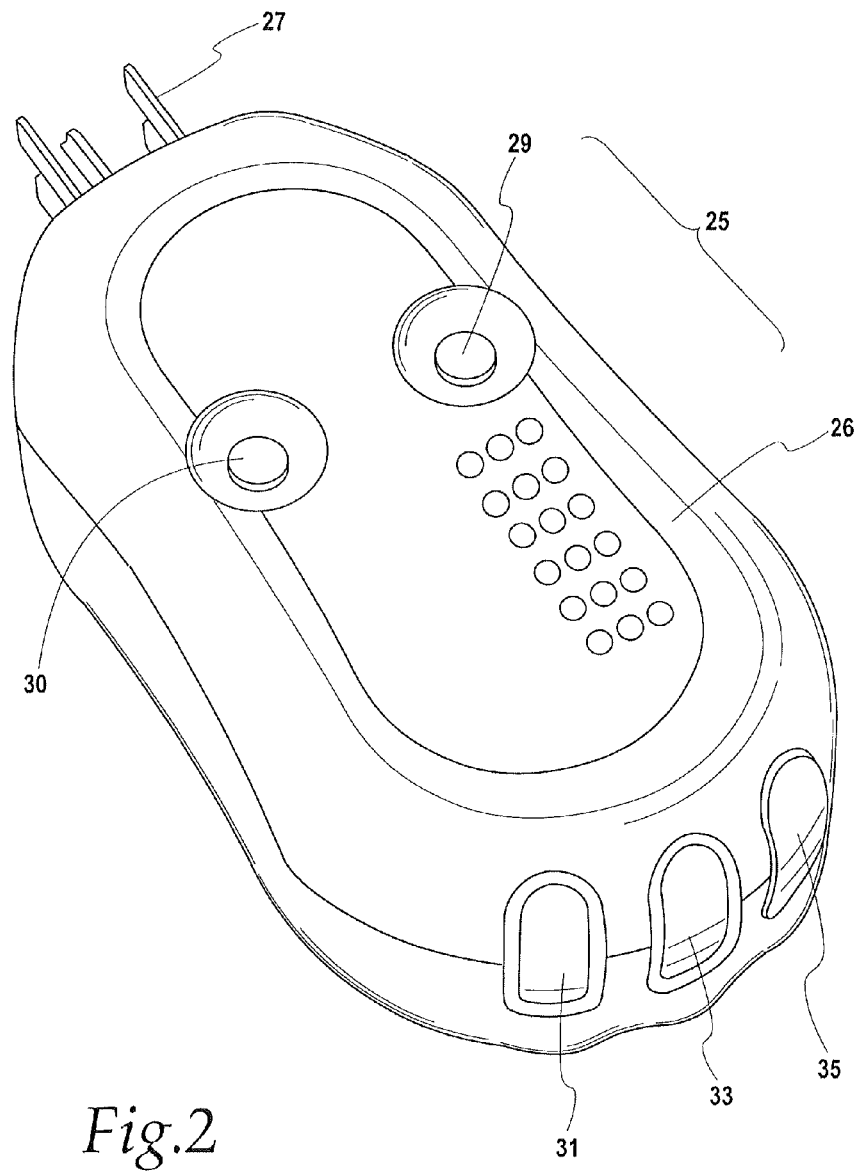
FIG. 2 is a perspective view of an arc fault circuit interrupter tester constructed in accordance with an embodiment of the disclosed invention.

Turning to the Figures, and to FIG. 1a in particular, a single phase 10 of an AC power system is depicted. In a standard AC power system an idealized power line waveform will be sinusoidal. When passed through a full-wave bridge rectifier, however, the rectified power waveform will comprise a series of positive half-cycles. A full cycle of rectified AC power can be broken into four quadrants, as shown in FIG. 1a. Quadrants 1 and 2 are identical to the non-rectified AC waveform; i.e., the first quadrant consists of rising voltages until a peak is reached at point 6, which starts the second quadrant that consists of falling voltages until, in an ideal system (without any voltage drops across diodes), zero voltage is reached at point 7. However, in a standard power system, voltages would continue passing through 0 Volts to a negative voltage. The rectified waveform shown in FIG. 1a, however, essentially repeats the first half cycle in the second half cycle, so that quadrant 3 is similar to quadrant 1, and quadrant 4 is similar to quadrant 2.

UL Standard 1436 specifies an industry standard method for testing AFCI circuit breakers. According to this standard, a test circuit must generate a sequence of 8-12 current pulses, each generating no fewer than 106 Amps, and no more than 141 Amps, with each lasting up to 833 microseconds. However, as cost is a major factor in the construction of AFCI test circuits, many, if not all, prior art AFCI testers can only generate pulses that the AFCI will experience the minimum rated current if the AFCI tester is disposed very close to the AFCI. This can be a serious issue as AFCis are usually disposed within a breaker cabinet; accordingly, an AFCI for, say an upstairs area in a residential home may have 30 meters or more of wiring between the AFCI and the nearest outlet on which a test circuit can be inserted. This amount of wiring can create a considerable amount of line resistance; potentially higher than the power transistors within an AFCI test circuit are designed to drive.

The invention disclosed herein addresses this issue by measuring the peak current of each current pulse generated by the AFCI test circuit and, if the generated current is not at a desired level, such as, for example, 113 Amp, the next voltage level at which the pulse is generated is adjusted. For example, a first pulse may be generated at a voltage level equal to 50% of the peak AC line voltage; i.e., 120V*sqrt(2)*0.5, or 84.85V for a 120 VAC 60 Hz system, as is common in the United States. If a current sensor within the AFCI test circuit indicates that the pulse generated was not sufficient to meet the required standard, the next pulse can be generated at a higher voltage such as 70.7% of the peak voltage, or approximately 120V for a 120 VAC 60 Hz system. This process would continue until either a pulse was generated at peak voltage, or the pulse met or exceeded the requirement for current. FIG. 1B depicts the relative magnitude of current pulses generated at different levels of an AC voltage waveform 23, assuming a constant resistance.

FIG. 2 is a perspective view of an AFCI test apparatus 25 constructed in accordance with the disclosed invention. As illustrated, the AFCI test apparatus 25 includes a housing 26, a plug 27 adapted to interface with a standard wall socket, an arc fault test activation button 29, a ground fault test activation button 30, and three LEDs 31, 33, 35 for displaying the result of a test. The housing may be constructed of, for example, an injection molded plastic, such as, polyethylene, polyvinyl chloride (PVC), or some other non-conductive plastic.

Figure 3:
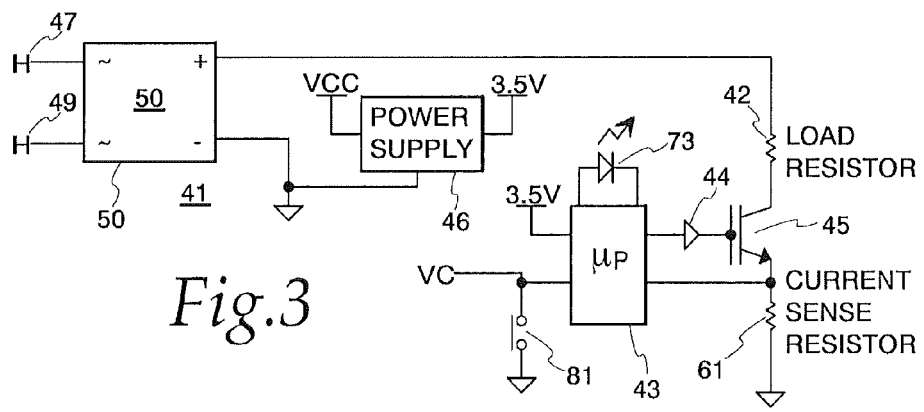
FIG. 3 is a simplified schematic diagram of an arc fault circuit interrupter test circuit constructed in accordance with an embodiment of the disclosed invention.

FIG. 3 is a simplified schematic view of an AFCI test circuit 41 constructed in accordance with the disclosed invention. A full-wave bridge rectifier 50 rectifies a power current delivered through a hot line 47 and a neutral line 49. A ground line 48 is coupled to the ground pin of the power outlet (not shown). The output of the rectifier 50 is smoothed and filtered using a power supply circuit 46, which generates a 15 VDC Vcc power line and a 3.5 VDC low voltage power line. The positive output of the full-wave bridge rectifier 50 is coupled to one or more power transistors 45 through a load resistor 42, which limits the maximum amount of current through the power transistor 45 when it is operated. A microcontroller 43 is electrically coupled to the power transistor 45 through a driver 44. When the control line is operated, the power transistor closes, thereby electrically coupling the positive rectified voltage to a reference voltage level through a current sense resistor 61. One side of the current sense resistor 61 is coupled to an analog-to-digital converter (ADC) channel of the microcontroller 43, which calculates the current flowing through the power transistor 45 using the sampled voltage and Ohms law.

The load resistor 42 is sized to create a sizable current spike in a power system coupled to the hot line connector 47 and the neutral line connector 49. For example, the load resistor 42 may be specified as about 0.33 ohms with a power rating between 1 Watt and 5 Watts, preferably around 2 W-2.5 W. Sense lines are also coupled to the hot line 47 and the neutral line 49 through voltage dividers so that the microcontroller 43 can monitor the instantaneous voltages at these important points. These sense lines provide information indicative of the instantaneous line voltage during the time that the power transistor is operated. A thermistor (not shown) is coupled to the power transistors 45 and to an ADC channel of the microcontroller 43 using a sense line. The thermistor provides a signal indicative of the temperature of the power transistor 45, and allows the microcontroller 43 to abort a test sequence before damaging the power transistors 45. The microcontroller also controls a green LED 73, which is illuminated when the disclosed AFCI test circuit is plugged in and properly functioning. A pushbutton 81 is coupled to the microcontroller 43, which monitors the status of the button, and when the button is pressed, the microcontroller begins an AFCI test cycle.

Figure 4:
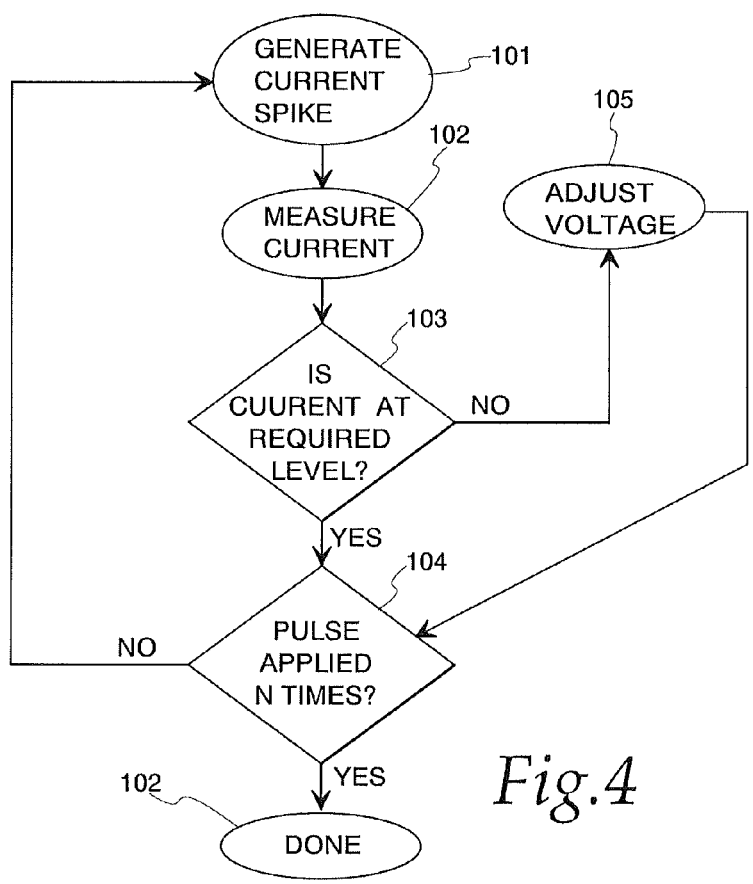
FIG. 4 is a simplified flowchart of a software or firmware program executed on a microcontroller integrated into and operating the test circuit of FIG. 3.

FIG. 4 depicts a simplified flow chart of the operation of a program for testing an AFCI that is executed by the microcontroller 43. In a first step 101, a quasi-short circuit is applied to the power system to be tested by, for example, operating the power transistor 45. While the quasi-short circuit is applied, the current is measured in a step 102 using, for example, an ADC channel of the microcontroller 43 coupled to a sense resistor 61. In step 103, the current is checked to see if it is at a desired level, such as, for example, 113 Amps, and if so, execution proceeds to step 104. However, if the current is not at a desired level, execution proceeds to step 105, where the applied voltage is increased or decreased as appropriate by changing the level of the AC voltage waveform at which the quasi-short is applied. From step 105 execution transitions to step 104. In step 104, a check is made to determine if the requisite number of current pulses have been applied. If so, execution proceeds to step 106, which concludes the test cycle, and where the operational status of the AFCI can be measured—if the AFCI has operated and opened the line, the test is successful; otherwise, the AFCI failed to operate properly. If the requisite number of current pulses has not been applied, execution transitions to step 101 where an additional pulse is generated.

Figure 5A:
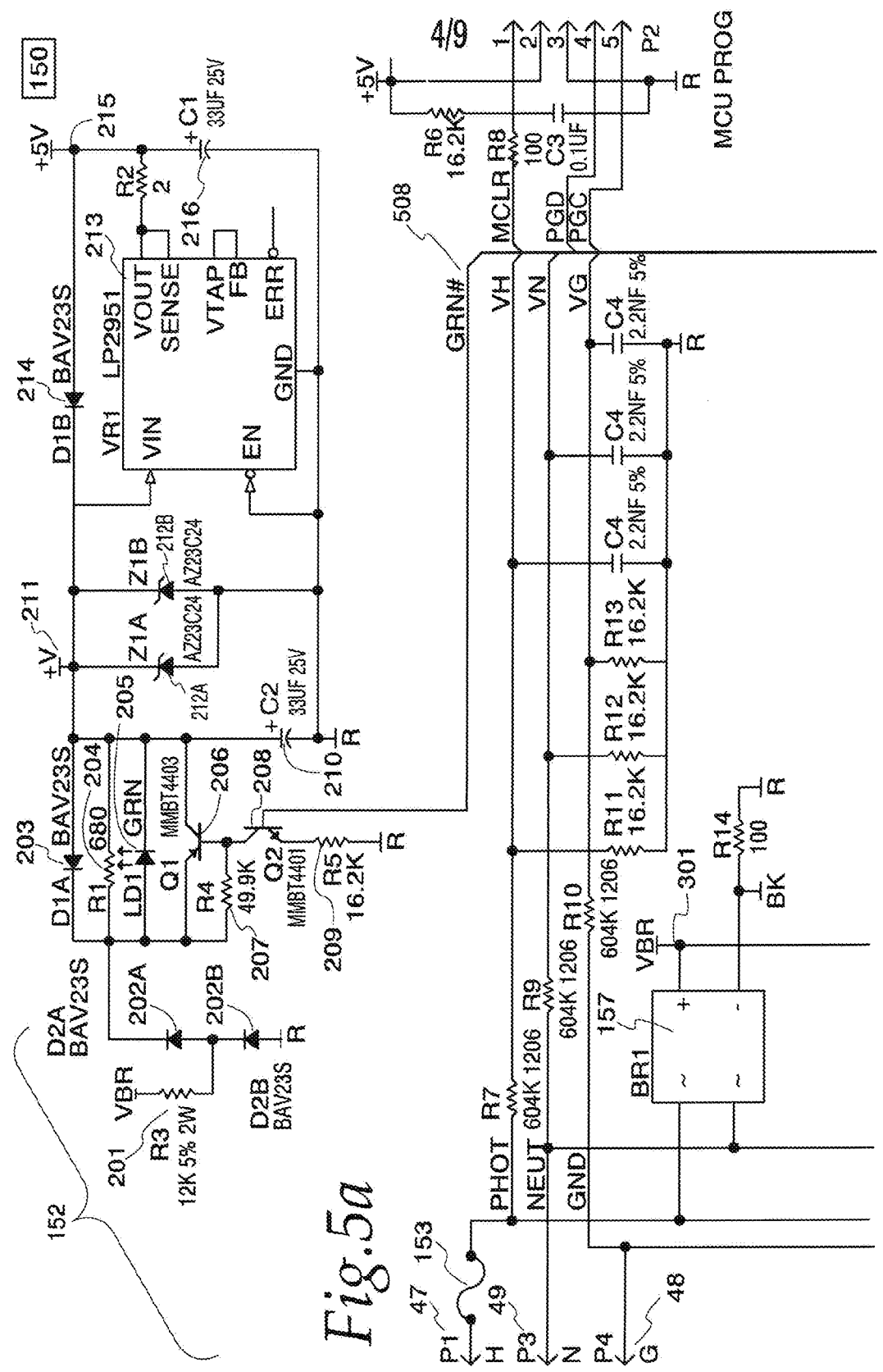
FIG. 5, which has been separated into three parts a-c, is a detailed schematic diagram of an arc fault circuit interrupter test circuit constructed in accordance with an embodiment of the disclosed invention.
Figure 5B:
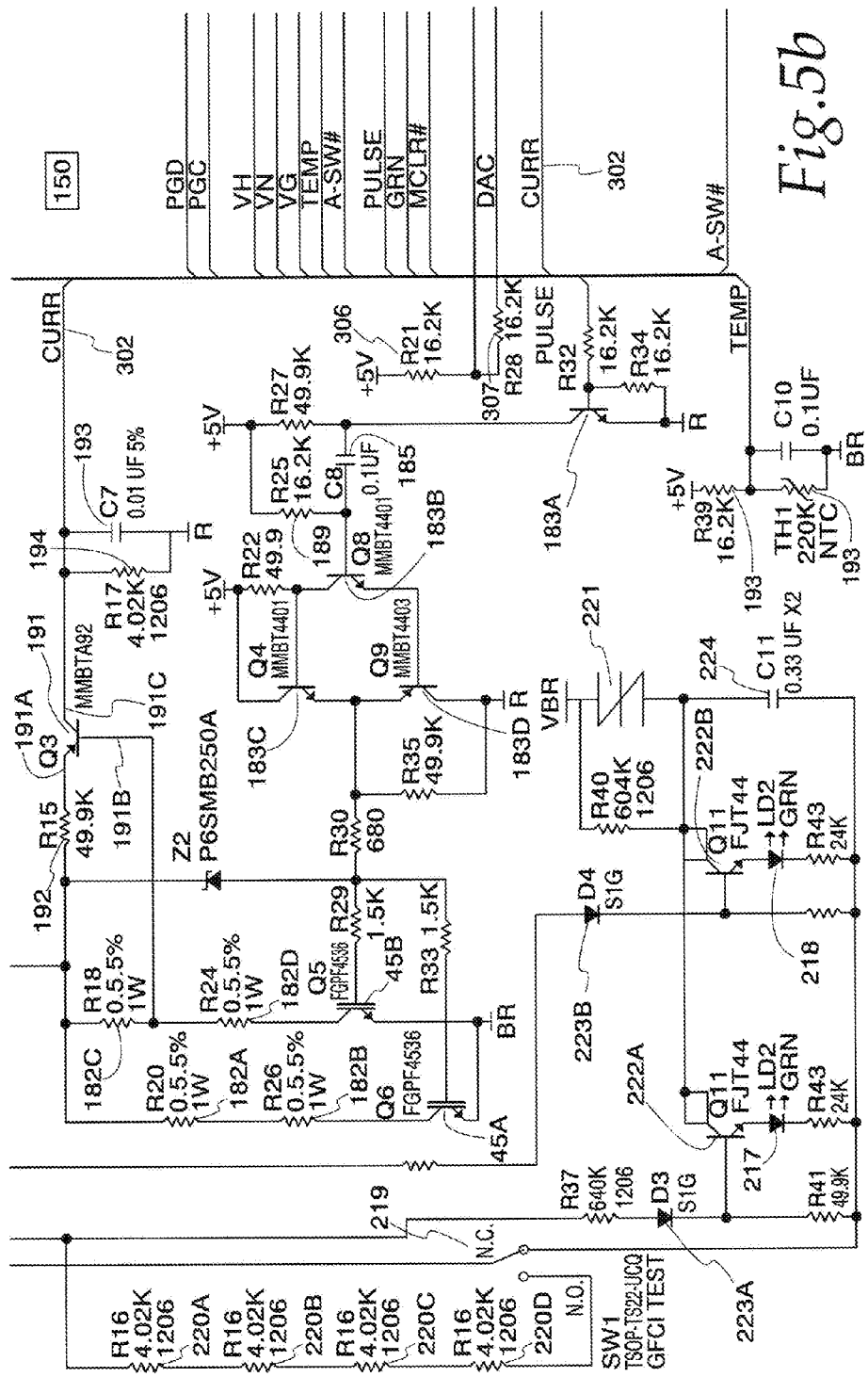
Figure 5C:
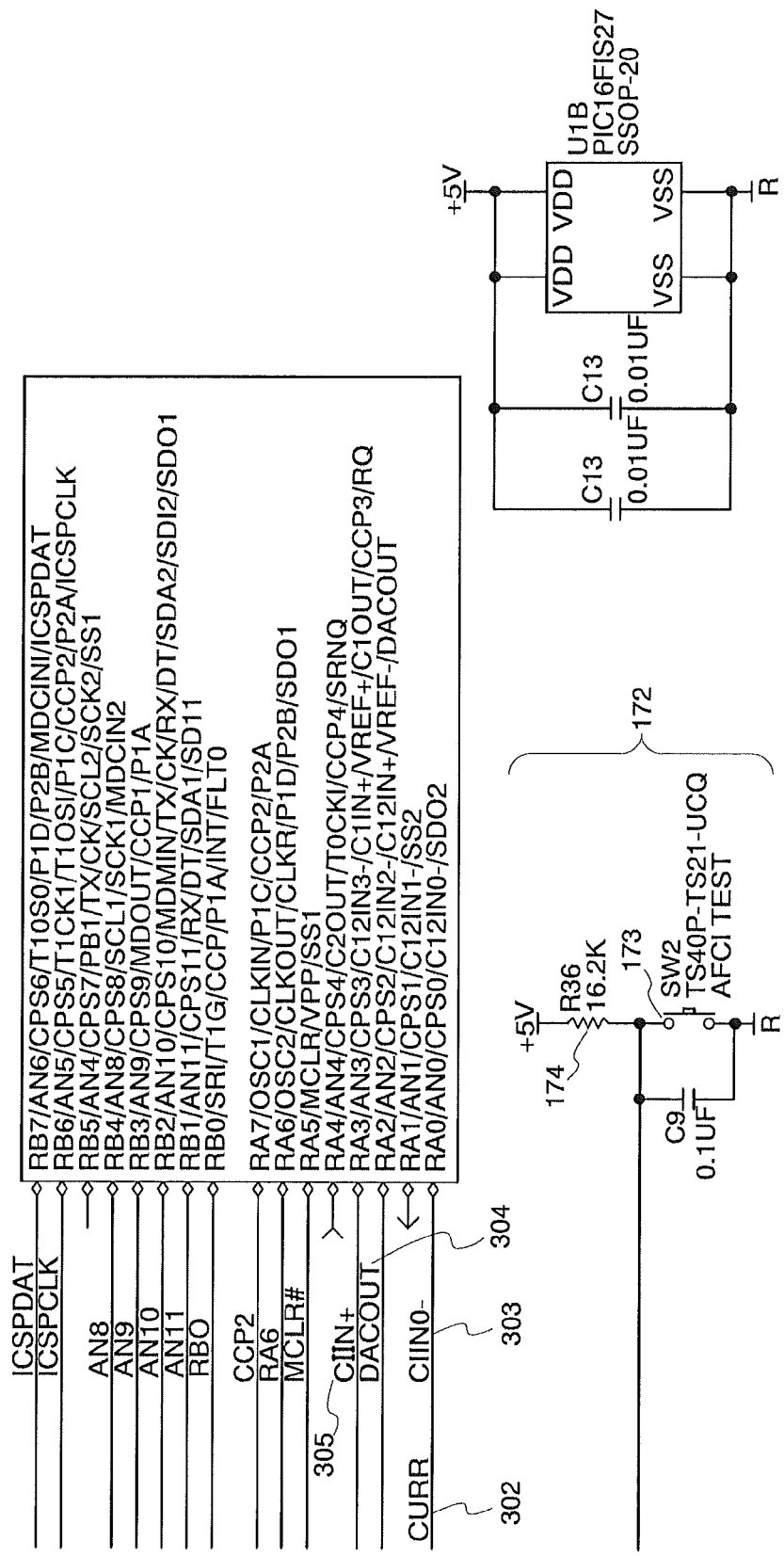

Turning to FIG. 5, a detailed schematic view of a circuit 150 implementing the disclosed AFCI tester is depicted. The circuit 150 includes a power supply circuit 152 comprising a fuse 153 coupled to a hot line connector 47 that is adapted to couple with a hot line of a localized power distribution system. The power supply circuit 152 also includes a neutral line connector 49 that is adapted to couple with a neutral line of a localized power distribution system.

The AC input terminals of full-wave bridge rectifier 157 are connected to the hot line 47 through fuse 153 and to the neutral line 49. The rectified positive output voltage VBR 301 is coupled via a power resistor 201, which may be around 2 W, to a half-wave rectifier circuit made up of dual diode 202A and 202B. Current flows through the network comprising LED 205 and resistor 204 into dual 24 volt Zener diodes 212A and 212B, clamping the voltage at the positive voltage rail 211 to about 24V. The 120 Hz ripple present at V8R 301 is filtered by capacitor 210. Voltage regulator 213 regulates the positive voltage rail 211 down to a 5V line 215. Capacitor 216, which may be about 33 microfarads and rated for about 25V, provides filtering for the 5 VDC power.

A pushbutton 172 provides a mechanism for a user to begin an AFCI test cycle. The pushbutton circuit 172 comprises a single-pole, single-throw pushbutton switch 173 coupled to a local reference voltage on one end and 5.0V on the other through a resistor 174, such as, for example, a 16.2K resistor.

A microcontroller 43 monitors the pushbutton circuit 172 to determine if a test cycle should be started. If a test cycle is started, the microcontroller 43 operates a line shorting circuit to test a coupled AFCI, and reports the results of the test using an LED display.

The line shorting circuit comprises full-wave bridge rectifier 157 that rectifies the line voltage and outputs an unfiltered DC signal, which is connected in series with a pair of parallel power IGBTs 45*a*,45*b* that are driven by the microcontroller 43 through gate drive transistors 183*a-d*. A pulse circuit comprised of capacitor 185 and resistors 187 and 189 ensures that power transistors 45*a*,45*b* are not held in a shorted position in case microcontroller 43 should experience an execution lockup, or some other failure occurs with the AFCI test circuit. Four load resistors 182*a-d*, each of which may be rated for 0.50 Ohms and about one Watt, limits the current through the power transistors 45*a*,45*b*. Current sensing transistor 191 has its base 191B connected across load resistor 182C and its emitter 191A connected through resistor 192 to VBR 301. Since the value of resistor 192, 49.9K, is about 100,000 times the value of load resistor 182C, the current flowing out of transistor 191 through its collector 191C will be about 0.00001 times the current flowing through load resistor 182C. This current flows through resistor 194 to develop a voltage 302 which provides an indication of the current flowing through the power transistors 45*a*,45*b* to the microcontroller 43. Capacitor 193 filters the voltage developed by resistor 194. The voltage 302 representing the amount of current being drawn through load resistor 182C could be coupled to an analog to digital input channel of microcontroller 43. In this embodiment 150, microcontroller 43 contains a voltage comparator and a digital to analog converter (DAC). The DAC output 304 is set by firmware in microcontroller 43 to a voltage ranging from 0 to 5V. This voltage is biased upward towards 5V by resistors 306 and 307, and fed as a voltage threshold to the positive comparator input 305 of microcontroller 43. The current signal 302 is coupled to the negative comparator input 303 of microcontroller 43. The comparator output within microcontroller 43 is disposed by firmware to cause a program interrupt when the current level passes the threshold set by DAC output 304, thereby providing faster response and finer control of current levels than an analog to digital conversion channel.

A thermistor 193 is positioned close to one of the power transistors 45*a*,45*b* to provide an indication of the amount of heat that a power transistor is dissipating, so that the microcontroller can cease a test cycle prior to damaging the power transistors 45*a*,45*b*, should that prove necessary. The microcontroller 43 also drives a green LED 205 through drive transistors 206 and 208. The green LED 203 is used to indicate the result of an AFCI test. Microcontroller 43 is programmed with firmware to operate LED 205. To turn LED 205 off, the firmware causes control signal 508 to operate to a logic high level; i.e., 5V, which turns on NPN transistor 208, thereby sinking current through resistors 207 and 209, and turning on PNP transistor 206. PNP transistor 206 essentially shorts LED 205, and current that would have flowed through LED 205 now flows through PNP transistor 206. To turn LED 205 on, the firmware in microcontroller 43 causes control signal 508 to operate to a logic low level; i.e., 0V, which turns NPN transistor 208 off. Resistor 207 pulls the base of PNP transistor 206 up to the same voltage as its emitter, turning PNP transistor 206 off, and allowing current to flow through LED 205, thereby turning it on. Shunt resistor 204 absorbs some of the available power supply current flow to equalize the brightness of LED 205 with the other two LEDs 217 and 218.

The disclosed circuit also includes additional functions than the arc fault circuit interrupter tester that has been previously discussed. In particular, circuit 150 includes a ground fault circuit interrupter (GFCI) test circuit comprised primarily of switch 219 and resistors 220*a-d*. The operation of GFCI test circuits is well known in the art, and is not further described herein. In addition, circuit 150 includes a pulse generation circuit comprised primarily of diac 221, transistors 222*a* and 222*b*, diodes 223*a* and 223*b* and capacitor 224. The purpose of this circuit is to identify a particular breaker within a breaker cabinet to which the test circuit is attached. This circuit and similar circuits are well known in the art, and descriptions of the operation of this circuit can be found in, for example, U.S. Pat. No. 6,844,712, which is hereby incorporated by reference in its entirety.

Figure 6A:
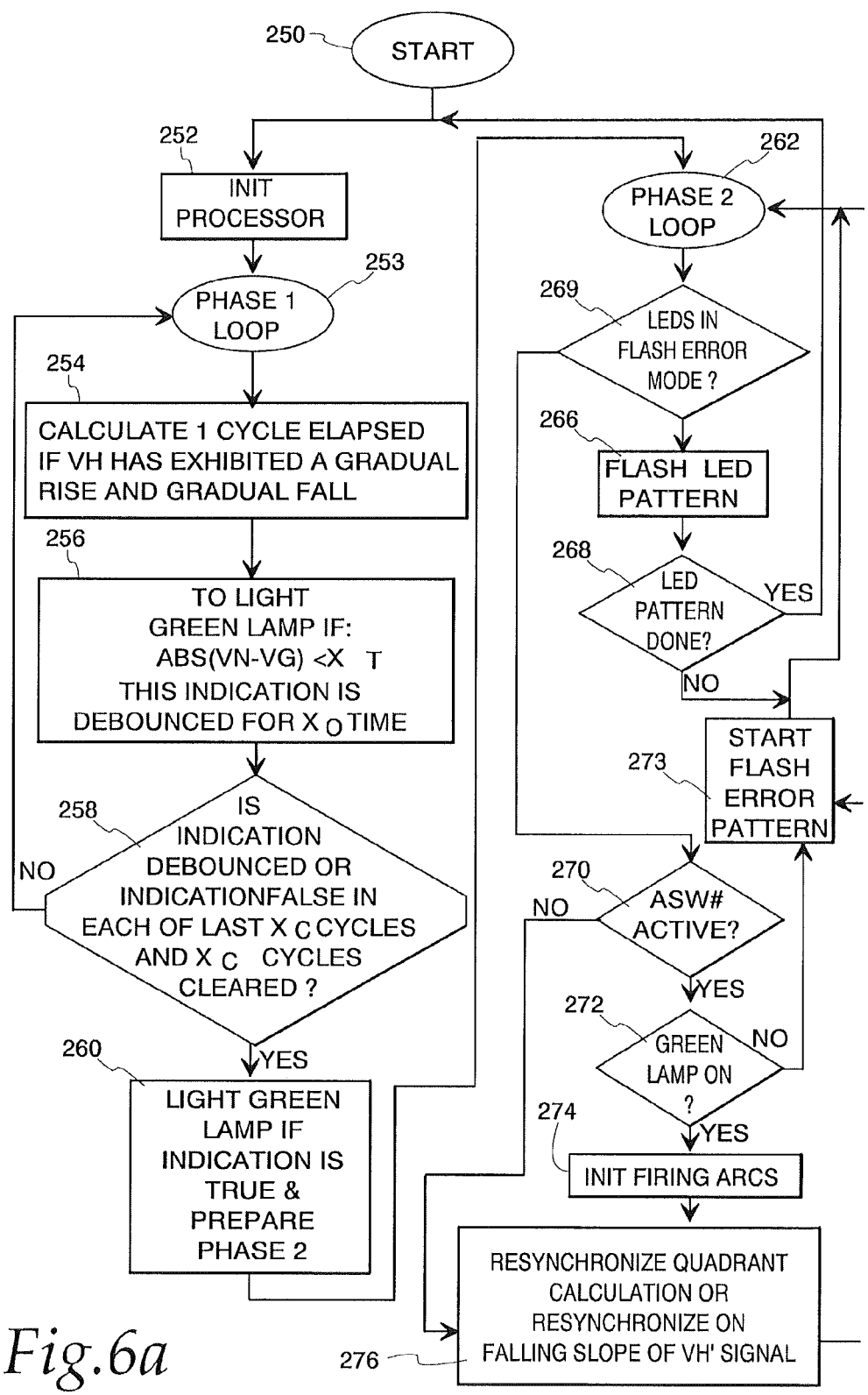
FIG. 6, which has been separated into three parts a-c, is a detailed flowchart of a software or firmware program executed on a microcontroller integrated into and operating the test circuit of FIG. 5.
Figure 6B:
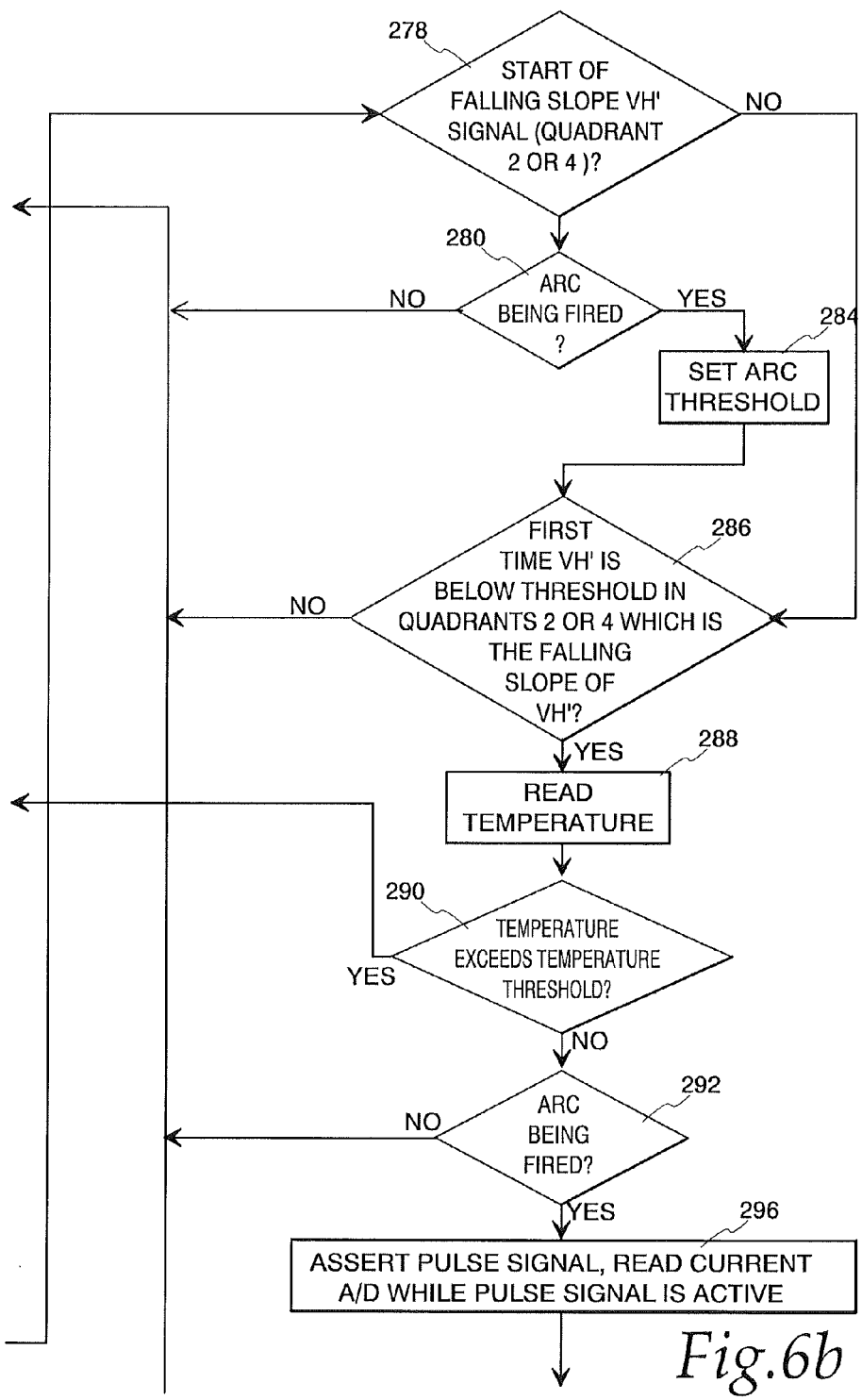

FIG. 6 depicts a flowchart describing the operation of a program for execution on microcontroller 43 to exercise the AFCI test circuit 150. Execution begins in step 250 and the microcontroller initializes in step 252. In step 253, the microcontroller enters the phase 1 loop, which is explained herein. In step 254 the $V_H$ signal is continuously monitored for gradual rise and fall. Each time it completes a cycle, a cycle counter is incremented. In step 256, a determination is made to light the green LED 205 if the absolute value of the measured neutral line voltage minus the measured ground line voltage is less than a value $X_T$, which is defined as a maximum difference between signals that could be attainable due to maximum effects of disturbance and noise and not due to actual hardware malfunction or signal abnormality. This determination may be made continuously, with outliers being discarded, and a determination to light the green LED made if the absolute value of the measured neutral line voltage minus the measured ground line voltage is less than $X_T$ at least $X_D$ times, which is a predetermined number selected to warrant a determination that the AC waveform is acceptable.

In step 258, a test is made to determine if the measured power lines have been sufficiently debounced, or if the indication has been false for the past $X_C$ cycles. If not, execution transitions back to the beginning of the phase 1 loop. Otherwise, execution transitions out of the phase 1 loop to step 260, where the green LED 205 is illuminated. In step 262, the phase 2 loop is entered. In step 264 a check is made to determine if the error mode is active, and the LEOs are being flashed because of it. If not, execution transitions to step 270. Otherwise, execution transitions to step 266, where an LED flash pattern is carried out. In step 268, a check is made to determine if the LED flash pattern is complete. If not, execution transitions to step 262. Otherwise execution transitions to step 252.

In step 270, a check is made to determine if the AFCI test switch has been pressed. If not, execution transitions to step 276, which is explained below. However, if it has been pressed, execution transitions to step 272, where a determination is made as to whether the green LED 205 is in the on state. If not, execution transitions to step 273, which initiates a flash error pattern, and directs execution to step 262. However, if the green LED 205 is activated, execution transitions to step 274, which initiates execution of the AFCI test, and generation of current pulses as explained earlier. In step 276, the phase and quadrant of the AC line voltage is calculated, such that synchronization is achieved with the falling edge of the $V_H$ signal.

In step 278, a check is made to determine if the angle of the AC line voltage is equal to the beginning of quadrant 2 or quadrant 4, which is when the $V_H$ signal is adapted to produce a falling edge. If not, execution transitions to step 286. However, if the angle of the AC line voltage is equal to the beginning of quadrant 2 or 4, execution transitions to step 280, where a test is made to determine if an arc test has been initiated (in step 274). If so, execution transitions to step 284, where the current pulse firing threshold is computed.

In step 286, a check is performed to determine the first time that the absolute level of $V_H$ is below the arc firing threshold and the phase of $V_H$ is within quadrants 2 or 4 as determined in step 278. If not, execution transitions to step 262. However, if it is, execution transitions to step 288, where the temperature of the monitored power IGBT is read using thermocouple 193. In step 290 a test is made to determine if the read temperature exceeds the temperature threshold, and, if so, execution transitions to step 273, where an error state is entered. However, if temperature remains within bounds, execution transitions to step 292, where a test is made to determine if an arc fault test is already being processed. If not, execution transitions to step 262. If step 292 determines that an arc fault test is being processed, then execution continues to step 296 where a pulse is initiated that will last for $X_A$ microseconds. The current level of the generated pulse is then read while the pulse is being fired.

Execution then transitions to step 298 where a test is made to determine if the current reading was higher than the maximum acceptable level. If so, the arc threshold is reduced in step 300, and execution transitions to step 306 (covered later herein). If the current reading is not higher than the maximum acceptable level in step 298, execution transitions to step 302 where a test is made to determine if the current reading was below the lowest acceptable level. If so, execution transitions to step 304, where the firing level of the arc is increased, and execution transitions to step 306, which is also where execution proceeds to if the current reading is not too low when tested in step 302.

In step 306 the remaining time of the pulse is allowed to expire. Execution then transitions to step 308, where a test is made to determine if the last arc was generated. If so, execution transitions to step 310, where an error state is entered, as the correct behavior is for the tester to turn off automatically after the last pulse is generated unless an error condition, such as over-current is present. Otherwise, execution transitions to step 262.

The foregoing description of the invention has been presented for purposes of illustration and description, and is not intended to be exhaustive or to limit the invention to the precise form disclosed. The description was selected to best explain the principles of the invention and practical application of these principles to enable others skilled in the art to best utilize the invention in various embodiments and various modifications as are suited to the particular use contemplated. It is intended that the scope of the invention not be limited by the specification, but be defined by the claims set forth below.

What is claimed is:

1. An arc fault circuit interrupter test circuit comprising:
   i. a line shorting circuit accepting a hot line of an electrical system and a neutral line of an electrical system;
   ii. a voltage sense circuit operatively coupled to the hot line of the electrical system and the neutral line of the electrical system for sensing an AC voltage waveform;
   iii. a current sense circuit for sensing current flow through said line shorting circuit;
   iv. a controller coupled to the voltage sense circuit, the current sense circuit, and to the line shorting circuit, the controller adapted to generate a sequence of control pulses for operating the line shorting circuit and generating a fault, wherein the controller is adapted to generate each control pulse at a specific voltage of the AC voltage waveform, and further adapted to measure a current generated by each control pulse and compare the current to a predetermined level, and when the current is less than the predetermined level, the controller is adapted to generate a next control pulse at a higher voltage level of the AC voltage waveform.

2. The test circuit of claim 1 wherein the controller is adapted to determine that current measured during a control pulse is greater than or equal to the predetermined level and wherein the controller is adapted to generate a total of twelve control pulses on consecutive half cycles at a voltage corresponding to the measured current.

3. The test circuit of claim 1 wherein the voltage sense circuit comprises:
   i. a voltage divider that is electrically coupled to one of said hot line of the electrical system and said neutral line of the electrical system; and
   ii. an analog to digital converter coupled to said voltage divider and to said controller, wherein said controller is adapted to periodically sample said analog to digital converter and based at least partially on said sampling determine a cycle time to operate a power transistor.

4. The test circuit of claim 1 wherein the current sense circuit comprises:

i. a sense resistor that is electrically coupled to the hot line of the electrical system and the neutral line of the electrical system when a power transistor is operated; and ii. an analog to digital converter coupled to said sense resistor and to said controller, wherein said controller is adapted to periodically sample said analog to digital converter and based at least partially on said sampling determine a cycle time to operate said power transistor.

5. The test circuit of claim 1 further comprising an indicator and wherein said controller is adapted to monitor said current sense circuit and based on said current sense circuit, operates said indicator.

6. The test circuit of claim 5 where the indicator includes at least one LED.

7. The test circuit of claim 6 wherein the indicator consists of a green LED.

8. The test circuit of claim of 7 wherein the controller is adapted to monitor the current sense circuit to determine if an arc fault circuit breaker electrically coupled to the test circuit has operated and wherein the controller is adapted to operate the indicator based on whether the arc fault circuit breaker has operated.

9. The test circuit of claim 1 further comprising a control pulse timing circuit for ensuring that a control pulse operating the line shorting circuit is finite in duration.

* * * * *